(12) United States Patent
Merilo et al.

(10) Patent No.: US 7,986,043 B2
(45) Date of Patent: Jul. 26, 2011

(54) INTEGRATED CIRCUIT PACKAGE ON PACKAGE SYSTEM

(75) Inventors: Dioscoro A. Merilo, Singapore (SG); Seng Guan Chow, Singapore (SG); Antonio B. Dimaano, Jr., Singapore (SG); Heap Hoe Kuan, Singapore (SG); Tsz Yin Ho, Tuen Mun (HK)

(73) Assignee: Stats Chippac Ltd., Singapore (SG)

( * ) Notice: Subject to any disclaimer, the term of this patent is extended or adjusted under 35 U.S.C. 154(b) by 439 days.

(21) Appl. No.: 11/276,646

(22) Filed: Mar. 8, 2006

(65) Prior Publication Data

US 2007/0210443 A1 Sep. 13, 2007

(51) Int. Cl.
*H01L 23/48* (2006.01)

(52) U.S. Cl. ........... 257/777; 257/704; 257/E27.137; 257/E27.144; 438/108

(58) Field of Classification Search ............ 257/704, 257/777
See application file for complete search history.

(56) References Cited

U.S. PATENT DOCUMENTS

| | | | |
|---|---|---|---|
| 5,147,815 A | 9/1992 | Casto | |
| 5,222,014 A | 6/1993 | Lin | |
| 5,625,228 A | 4/1997 | Rogren | |
| 5,685,477 A | 11/1997 | Mallik et al. | |
| 6,168,975 B1 | 1/2001 | Zhang et al. | |
| 6,190,944 B1 * | 2/2001 | Choi | 438/109 |
| 6,229,200 B1 | 5/2001 | Mclellan et al. | |
| 6,420,779 B1 | 7/2002 | Sharma et al. | |
| 6,420,799 B1 | 7/2002 | Sakamoto et al. | |
| 6,607,937 B1 * | 8/2003 | Corisis | 438/108 |
| 6,815,806 B1 | 11/2004 | Awad et al. | |
| 6,838,751 B2 | 1/2005 | Cheng et al. | |
| 6,861,288 B2 | 3/2005 | Shim et al. | |
| 6,906,416 B2 | 6/2005 | Karnezos | |
| 6,917,097 B2 * | 7/2005 | Chow et al. | 257/666 |
| 6,927,096 B2 | 8/2005 | Shimanuki | |
| 6,933,598 B2 | 8/2005 | Karnezos | |
| 7,045,887 B2 | 5/2006 | Karnezos | |
| 7,049,691 B2 | 5/2006 | Karnezos | |
| 7,053,477 B2 | 5/2006 | Karnezos et al. | |
| 7,057,269 B2 | 6/2006 | Karnezos | |
| 7,061,088 B2 | 6/2006 | Karnezos | |
| 7,101,731 B2 | 9/2006 | Karnezos | |
| 7,163,842 B2 | 1/2007 | Karnezos | |
| 7,166,494 B2 | 1/2007 | Karnezos | |
| 7,169,642 B2 | 1/2007 | Karnezos | |
| 7,180,166 B2 | 2/2007 | Ho et al. | |
| 7,235,871 B2 | 6/2007 | Corisis | |
| 7,247,519 B2 | 7/2007 | Karnezos et al. | |
| 7,247,934 B2 | 7/2007 | Pu | |
| 7,253,511 B2 | 8/2007 | Karnezos et al. | |
| 7,288,434 B2 | 10/2007 | Karnezos | |

(Continued)

OTHER PUBLICATIONS

Daily, James W. Packaging of Electronic Systems—A Mechanical Engineering Approach. 1990. McGraw-Hill. ISBN 0-07-015214-4. pp. 97-98.*

*Primary Examiner* — Ajay K Arora
(74) *Attorney, Agent, or Firm* — Mikio Ishimaru

(57) ABSTRACT

An integrated circuit package on package system including forming an interconnect integrated circuit package and attaching an extended-lead integrated circuit package on the interconnect integrated circuit package wherein a mold cap of the extended-lead integrated circuit package faces a mold cap of the interconnect integrated circuit package.

20 Claims, 3 Drawing Sheets

U.S. PATENT DOCUMENTS

| | | |
|---|---|---|
| 7,291,926 B2 | 11/2007 | Tao et al. |
| 7,351,610 B2 | 4/2008 | Karnezos |
| 7,358,115 B2 | 4/2008 | Karnezos |
| 7,364,946 B2 | 4/2008 | Karnezos |
| 7,372,141 B2 | 5/2008 | Karnezos et al. |
| 7,394,148 B2 | 7/2008 | Karnezos |
| 7,429,786 B2 | 9/2008 | Karnezos et al. |
| 7,429,787 B2 | 9/2008 | Karnezos et al. |
| 2002/0041019 A1* | 4/2002 | Gang ............ 257/678 |
| 2002/0109216 A1 | 8/2002 | Matsuzaki et al. |
| 2002/0167074 A1* | 11/2002 | Kim ............ 257/666 |
| 2004/0114426 A1 | 6/2004 | Fee et al. |
| 2007/0209834 A1 | 9/2007 | Kuan et al. |
| 2007/0210424 A1 | 9/2007 | Ho et al. |

\* cited by examiner

INTEGRATED CIRCUIT PACKAGE ON PACKAGE SYSTEM

CROSS-REFERENCE TO RELATED APPLICATION(S)

The present application contains subject matter related to a concurrently filed U.S. patent application Ser. No. 11/276,645, assigned to STATS ChipPAC Ltd.

The present application contains subject matter also related to a co-pending U.S. patent application Ser. No. 11/276,647, assigned to STATS ChipPAC Ltd.

TECHNICAL FIELD

The present invention relates generally to integrated circuit package systems, and more particularly to an integrated circuit package system for a package on package.

BACKGROUND ART

Integrated circuits ("IC's") have become such an integral part of so many daily activities that the needs for IC's continue to demand higher performance, lower cost, increased miniaturization of components, and greater packaging density of IC's. As new generations of IC products are released, their functionality increases while the size and number of components decreases. These demands make the IC's susceptible to damage during manufacturing and in use. Commonly, a package is used which both protects the circuit and provides electrical interconnections to external circuitry. The package often encases the IC and its connectivity to the electrical interconnections.

IC devices are constructed from a silicon or gallium arsenide wafer through a process that comprises a number of deposition, masking, diffusion, etching, and implanting steps. Usually, many individual devices are constructed on the same wafer. When the devices are separated into individual rectangular units, each takes the form of an IC die. In order to interface a die with other circuitry, it is common to mount it on a leadframe or on a multi-chip module substrate that is surrounded by a number of lead fingers. Each die has bonding pads that are then individually connected in a wire-bonding operation to the leadframe's lead finger pads using extremely fine gold or aluminum wires. The assemblies are then packaged by individually encapsulating them in molded plastic or ceramic bodies.

IC packaging technology has shown an increase in semiconductor chip density (the number of chips mounted on a single circuit board or substrate) that parallels the reduction in the number of components that are needed for a circuit. This results in packaging designs that are more compact, in form factors (the physical size and shape of a device) that are more compact, and in a significant increase in overall IC density. However, IC density continues to be limited by the space (or "real estate") available for mounting individual die on a substrate.

To condense further the packaging of individual devices, packages have been developed in which more than one device can be packaged at one time at each package site. Each package site is a structure that provides mechanical support for the individual IC devices. It also provides one or more layers of interconnect lines that enable the devices to be connected electrically to surrounding circuitry. Of importance to complicated packaging designs are considerations of input/output count, heat dissipation, matching of thermal expansion between a motherboard and its attached components, cost of manufacturing, ease of integration into an automated manufacturing facility, package reliability, and easy adaptability of the package to additional packaging interfaces such as a printed circuit board ("PCB").

In some cases, multi-chip devices can be fabricated faster and more cheaply than a corresponding single IC chip, that incorporates all the same functions. Current multi-chip modules typically consist of a PCB substrate onto which a set of separate IC chip components is directly attached. Such multi-chip modules have been found to increase circuit density and miniaturization, improve signal propagation speed, reduce overall device size and weight, improve performance, and lower costs—all primary goals of the computer industry.

However, such multi-chip modules can be bulky. IC package density is determined by the area required to mount a die or module on a circuit board. One method for reducing the board size of multi-chip modules and thereby increase their effective density is to stack the die or chips vertically within the module or package.

Such designs are improvements over prior multi-chip package and system-in-a-package ("SiP") designs that combined several semiconductor die and associated passive components ("passives") side by side in a single, horizontal layer. Combining them into a single horizontal layer used board space inefficiently by consuming large substrate areas, and afforded less advantage in circuit miniaturization.

However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that are free of defects are then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process problems including yield.

Despite the advantages of recent developments in semiconductor fabrication and packaging techniques, there is a continuing need for improved packaging methods, systems, and designs for increasing semiconductor die density in PCB assemblies.

Thus, a need still remains for an integrated circuit package on package system to provide improved reliability and manufacturing yield. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package on package system, forming an interconnect integrated circuit package, and attaching an extended-lead integrated circuit package on the interconnect integrated circuit package wherein a mold cap of the extended-lead integrated circuit package faces a mold cap of the interconnect integrated circuit package.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
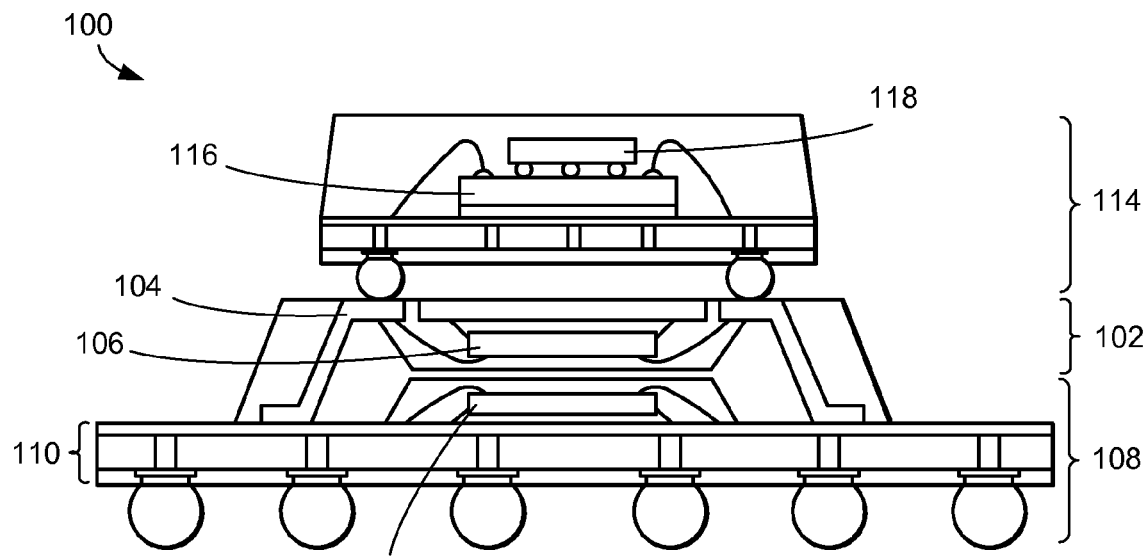
FIG. 1 is a cross-sectional view of an integrated circuit package on package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. The term "on" refers to direct contact among elements. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package on package system 100 in an embodiment of the present invention. The integrated circuit package on package system 100 includes an extended-lead integrated circuit package 102. The extended-lead integrated circuit package 102 includes an extended-lead leadframe 104. A first integrated circuit 106 is attached to the extended-lead leadframe 104. For illustrative purposes, the first integrated circuit 106 is shown as a wire bondable integrated circuit, although it is understood that the first integrated circuit 106 may be different, such as a flip chip. Further, for illustrative purposes the extended-lead integrated circuit package 102 is shown with one integrated circuit, although it is understood that any number of integrated circuits may be included.

The integrated circuit package on package system 100 also includes an interconnect integrated circuit package 108 having a substrate 110. A second integrated circuit 112 is attached and electrically connected to the substrate 110. The extended-lead integrated circuit package 102 is also attached to the substrate 110 providing electrical connectivity for the first integrated circuit 106 to the substrate 110. A top integrated circuit package 114 includes a first top integrated circuit 116 and a second top integrated circuit 118 electrically connected to the substrate 110 through the extended-lead leadframe 104. It has been discovered that the extended-lead leadframe 104 may serve as an interposer for additional packages, such as the top integrated circuit package 114.

For illustrative purposes the second integrated circuit 112 and the first top integrated circuit 116 are shown as wire bondable integrated circuits, although it is understood that the second integrated circuit 112 and the first top integrated circuit 116 may be different, such as a flip chip or a passive device. Further, for illustrative purposes the second top integrated circuit 118 is shown as a flip chip, although it is understood that the second top integrated circuit 118 may be different, such as a wire bondable integrated circuit or a passive device. Yet further, for illustrative purposes the interconnect integrated circuit package 108 is shown with one integrated circuit, although it is understood that any number of integrated circuits may be included.

Figure 2:
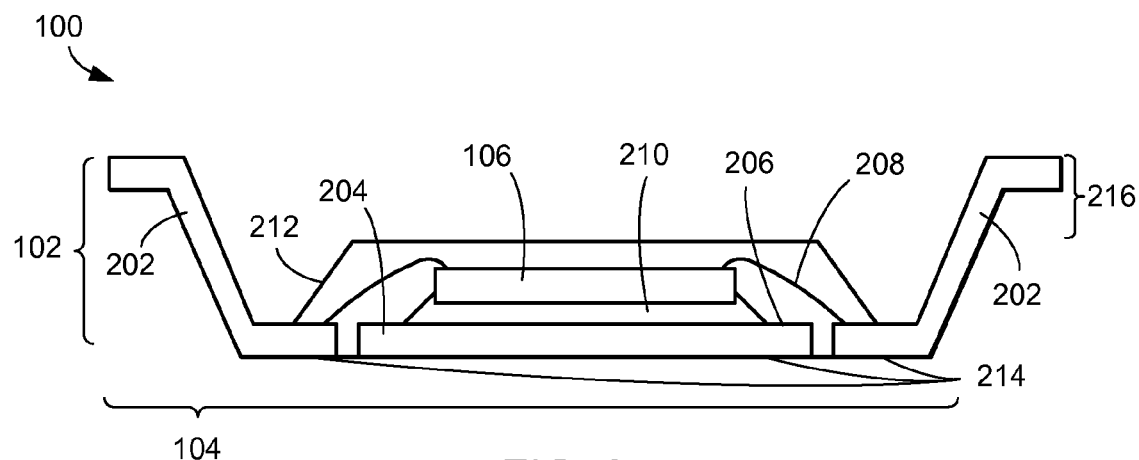
FIG. 2 is a cross-sectional view of the integrated circuit package on package system in an extended-lead package forming phase.

Referring now to FIG. 2, therein is shown a cross-sectional view of the integrated circuit package on package system 100 in an extended-lead package forming phase. The extended-lead integrated circuit package 102 includes the extended-lead leadframe 104 having extended leads 202 and a die paddle 204. The extended leads 202 are formed by a trim and form process in which the extended leads 202 are bent to a predetermined shape and a predetermined height. The extended leads 202 are bent in an upward direction towards a top surface 206 of the die paddle 204 and towards the first integrated circuit 106.

The extended leads 202 may include inner leads and outer leads wherein both the inner leads and the outer leads may include plating, such as an alloy of lead (Pb), tin (Sn), silver (Ag) or copper (Cu). The plating provides a connectivity surface 214 for improved interconnection of devices, such as the top integrated circuit package 114, other integrated circuits or packages. The connectivity surface 214 can preferably form a plane including a plane of the die paddle 204 coplanar to a plane of the extended leads 202. The extended leads 202 are formed outside a perimeter of the die pad 204 and the first integrated circuit 106 with an isolation region separating extents of the die pad 204 and extents of the first integrated circuit 106.

A first die attach layer 210, such as an adhesive, may mount the first integrated circuit 106 to the top surface 206 of the die paddle 204. First die connectors 208 electrically connect the first integrated circuit 106 to the extended leads 202 of the extended-lead leadframe 104. An encapsulant 212, such as an extended-lead package encapsulant, may be used to protect the first integrated circuit 106, the first die connectors 208 and part of the extended-lead leadframe 104. A molding process, such as film-assist, forms the encapsulant 212 flush to an inner portion of the extended leads 202 and the die paddle 204. The encapsulant 212 is formed with a thickness lower than a height of the extended leads 202 providing an extended-lead extension 216 of the extended leads 202 beyond an extent of the encapsulant 212 over the first integrated circuit 106 such as a mold cap. The extended-lead extension 216 provides space or clearance for the second integrated circuit 112 of FIG. 1.

The extended-lead integrated circuit package 102 may be tested as a discrete package. The testing includes the first integrated circuit 106 through the first die connectors 208 and the extended leads 202. Functional tests as well as performance tests may be performed on the extended-lead integrated circuit package 102. Validating the integrity and performance of components in the packaging provides a known good package with known good die. The known good package improves yield, reliability and quality of not only the integrated circuit package on package system 100 but of a next level system, such as a printed circuit board or another package.

Figure 3:
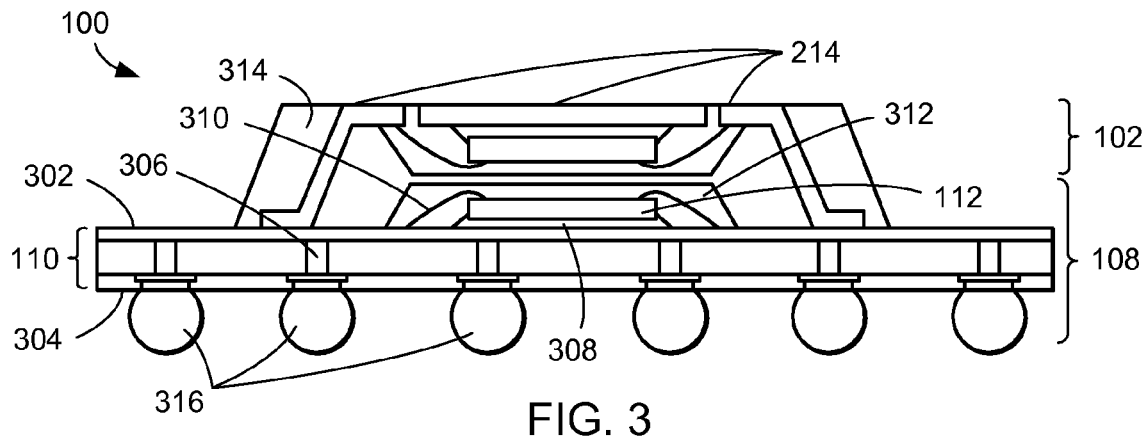
FIG. 3 is a cross-sectional view of the integrated circuit package on package system in an extended-lead package mounting phase.

Referring now to FIG. 3, therein is shown a cross-sectional view of the integrated circuit package on package system 100 in an extended-lead package mounting phase. The interconnect integrated circuit package 108 includes the substrate 110 having a mounting surface 302, a second encapsulant 312 such as an interconnect package encapsulant, and a connection surface 304. Substrate connectors 306 connect the mounting surface 302 to the connection surface 304. A second die attach layer 308, such as an adhesive, may mount the second integrated circuit 112 to the mounting surface 302 of the substrate 110. Second die connectors 310 electrically connect the second integrated circuit 112 to the substrate 110. The second encapsulant 312 may be applied to protect the second integrated circuit 112, the second die connectors 310 and a portion of the substrate 110. The interconnect integrated circuit package 108 may also be formed without the second encapsulant 312.

The interconnect integrated circuit package 108 may be tested as a discrete package. The testing includes the second integrated circuit 112 through the second die connectors 310 and the substrate 110 because the encapsulant 312 can be formed completely covering the second integrated circuit 112 and directly on the mounting surface 302 of the substrate 110. Functional tests as well as performance tests may be performed on the interconnect integrated circuit package 108. Validating the integrity and performance of components in the packaging provides a known good package with known good die. The known good package improves yield, reliability and quality of not only the integrated circuit package on package system 100 but of the next level system.

The extended leads 202 of the extended-lead integrated circuit package 102 are also attached to the mounting surface 302 of the substrate 110. The extended leads 202 electrically connect the extended-lead integrated circuit package 102 to the interconnect integrated circuit package 108. A third encapsulant 314, such as a package encapsulant, may be applied over the extended-lead integrated circuit package 102 and the interconnect integrated circuit package 108. The third encapsulant 314 may cover and protect the extended-lead integrated circuit package 102 with the connectivity surface 214 of the extended leads 202 and the die paddle 204 substantially exposed on a side of the extended-lead integrated circuit package 102 opposite the interconnect integrated circuit package 108 for electrical connectivity. The extended leads 202 are exposed from both the third encapsulant 314 and the encapsulant 212 of FIG. 2. The third encapsulant 314 in combination with the extended leads 202 and the encapsulant 212 function as a mold locking feature for the integrated circuit package on package system 100. The third encapsulant 314 locks the extended leads 202 to the substrate 110, locks the second encapsulant 312 to the substrate 110, and locks the extended leads 202 to the encapsulant 212. The mold locking feature improves performance in moisture sensitivity level (MSL) tests, increases structural rigidity, and improves reliability of the integrated circuit package on package system 100. The system connectors 316 may be attached to the connection surface 304 of the substrate 110 to provide electrical connectivity to the next level system.

Figure 4:
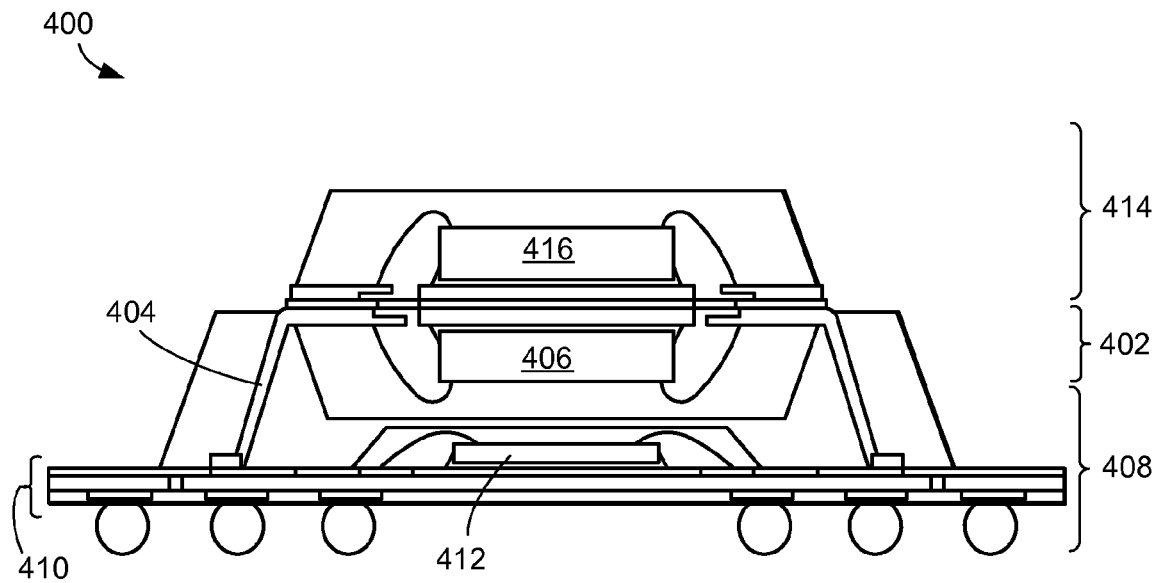
FIG. 4 is a cross-sectional view of an integrated circuit package on package system in an alternative embodiment of the present invention.

Referring now to FIG. 4, therein is shown a cross-sectional view of an integrated circuit package on package system 400 in an alternative embodiment of the present invention. The integrated circuit package on package system 400 includes an extended-lead integrated circuit package 402. The extended-lead integrated circuit package 402 includes an extended-lead leadframe 404. A first integrated circuit 406 is attached to the extended-lead leadframe 404. For illustrative purposes, the first integrated circuit 406 is shown as a wire bondable integrated circuit, although it is understood that the first integrated circuit 406 may be different, such as a flip chip. Further, for illustrative purposes the extended-lead integrated circuit package 402 is shown with one integrated circuit, although it is understood that any number of integrated circuits may be included.

The integrated circuit package on package system 400 also includes an interconnect integrated circuit package 408 having a substrate 410. A second integrated circuit 412 is attached and electrically connected to the substrate 410. The extended-lead integrated circuit package 402 is also attached to the substrate 410 providing electrical connectivity for the first integrated circuit 406 to the substrate 410. The extended-lead integrated circuit package 402 may be surface mounted, by the following process such as solder paste pin transfer, pick and place, and reflow.

A top integrated circuit package 414, such as a quad flat no lead (QFN), includes a top integrated circuit 416 electrically connected to the substrate 410 through the extended-lead leadframe 404. The top integrated circuit package 414 may be surface mounted, by the following process such as solder paste pin transfer, pick and place, and reflow. It has been discovered that the extended-lead leadframe 404 may serve as an interposer for additional packages, such as the top integrated circuit package 414.

For illustrative purposes, the second integrated circuit 412 and the top integrated circuit 416 are shown as wire bondable integrated circuits, although it is understood that the second integrated circuit 412 and the top integrated circuit 416 may be different, such as a flip chip or a passive device. Further, for illustrative purposes the interconnect integrated circuit package 408 and the top integrated circuit package 414 are shown with one integrated circuit, although it is understood that any number of integrated circuits may be included.

Figure 5:
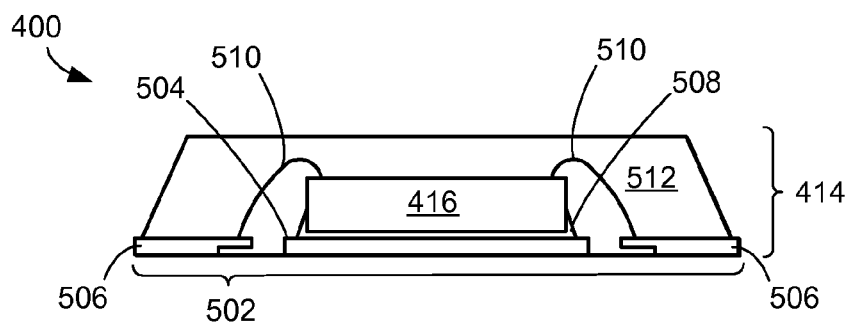
FIG. 5 is a cross-sectional view of the integrated circuit package on package system in a top package forming phase.

Referring now to FIG. 5, therein is shown a cross-sectional view of the integrated circuit package on package system 400 in a top package forming phase. The top integrated circuit package 414, such as a quad flat no lead (QFN) includes a top leadframe 502 having a top die paddle 504 and top leads 506. A top die attach layer 508, such as an adhesive, may mount the top integrated circuit 416 to the top die paddle 504 of the top leadframe 502. The top integrated circuit 416 may be a device such as input/output (I/O), analog to digital (A/D) or a sensor. Top die connectors 510 electrically connect the top integrated circuit 416 to the top leadframe 502. A top encapsulant 512 may be applied to protect the top integrated circuit 416, the top die connectors 510 and a portion of the top leadframe 502.

The top integrated circuit package 414 may be tested as a discrete package. The testing includes the top integrated circuit 416 through the top die connectors 510 and the top leads 506. Functional tests as well as performance tests may be performed on the top integrated circuit package 414. Validating the integrity and performance of components in the packaging provides a known good package with known good die. The known good package improves yield, reliability and quality of not only the integrated circuit package on package system 400 but of the next level system.

Figure 6:
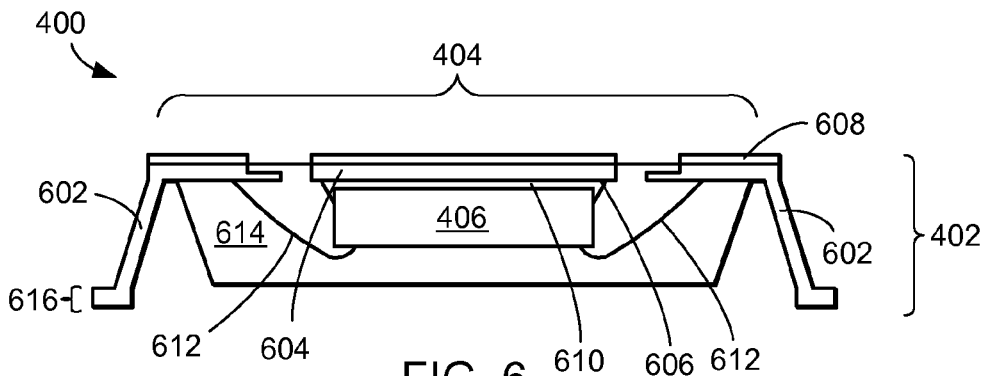
FIG. 6 is a cross-sectional view of the integrated circuit package on package system in an extended-lead package forming phase.

Referring now to FIG. 6, therein is shown a cross-sectional view of the integrated circuit package on package system 400 in an extended-lead package forming phase. The extended-lead integrated circuit package 402, such as a leaded package, includes the extended-lead leadframe 404 having extended leads 602 and a die paddle 604. The extended leads 602 are formed by a trim and form process in which the extended leads 602 are bent to a predetermined shape and a predetermined height. The extended leads 602 are bent in a direction towards a die attach surface 606 of the die paddle 604 and towards the first integrated circuit 406.

The extended leads 602 may include inner leads and outer leads wherein both the inner leads and the outer leads may include plating, such as an alloy of lead (Pb), tin (Sn), silver (Ag) or copper (Cu). The plating provides a connectivity surface 608 for improved interconnection of devices, such as the top integrated circuit package 414, other integrated circuits or packages.

A first die attach layer 610, such as an adhesive, may mount the first integrated circuit 406 to the die attach surface 606 of the die paddle 604. The first integrated circuit 406 may be a device such as a memory. First die connectors 612 electrically connect the first integrated circuit 406 to the extended leads 602 of the extended-lead leadframe 404. A first encapsulant 614 may be used to protect the first integrated circuit 406, the first die connectors 612 and part of the extended-lead leadframe 404. A molding process, such as film-assist, forms the first encapsulant 614 flush to an inner portion of the extended leads 602 and the die paddle 604. The first encapsulant 614 is formed with a thickness lower than a height of the extended leads 602 providing an extended-lead extension 616 of the extended leads 602 beyond an extent of the first encapsulant 614 over the first integrated circuit 406 such as a mold cap. The extended-lead extension 616 provides space or clearance for the second integrated circuit 412 of FIG. 4.

The extended-lead integrated circuit package 402 may be tested as a discrete package. The testing includes the first integrated circuit 406 through the first die connectors 612 and the extended leads 602. Functional tests as well as performance tests may be performed on the extended-lead integrated circuit package 402. Validating the integrity and performance of components in the packaging provides a known good package with known good die. The known good package improves yield, reliability and quality of not only the integrated circuit package on package system 400 but of a next level system, such as a printed circuit board or another package.

Figure 7:
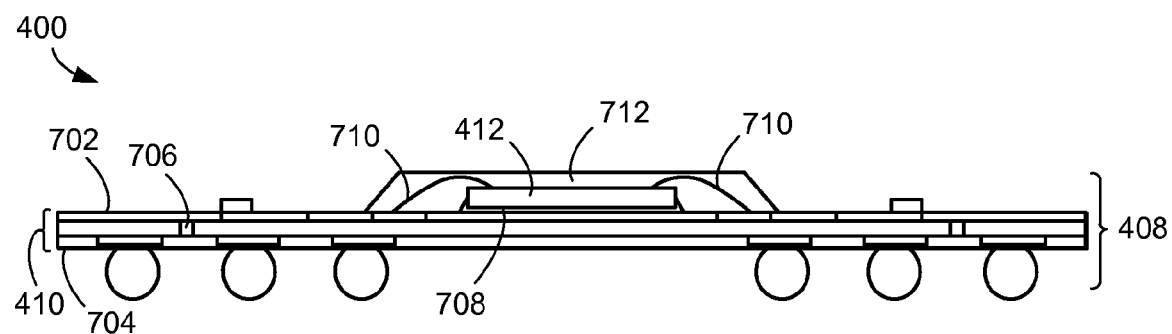
FIG. 7 is a cross-sectional view of the integrated circuit package on package system in an interconnect package forming phase.

Referring now to FIG. 7, therein is shown a cross-sectional view of the integrated circuit package on package system 400 in an interconnect package forming phase. The interconnect integrated circuit package 408 includes the substrate 410 having a mounting surface 702 and a connection surface 704. Substrate connectors 706 connect the mounting surface 702 to the connection surface 704.

A second die attach layer 708, such as an adhesive, may mount the second integrated circuit 412 to the mounting surface 702 of the substrate 410. The second integrated circuit 412 may be a device such as a processor or other logic. Second die connectors 710 electrically connect the second integrated circuit 412 to the substrate 410. A second encapsulant 712 may be applied to protect the second integrated circuit 412, the second die connectors 710 and a portion of the substrate 410. The interconnect integrated circuit package 408 may also be formed without the second encapsulant 712.

The interconnect integrated circuit package 408 may be tested as a discrete package. The testing includes the second integrated circuit 412 through the second die connectors 710 and the substrate 410. Functional tests as well as performance tests may be performed on the interconnect integrated circuit package 408. Validating the integrity and performance of components in the packaging provides a known good package with known good die. The known good package improves yield, reliability and quality of not only the integrated circuit package on package system 400 but of the next level system.

Figure 8:
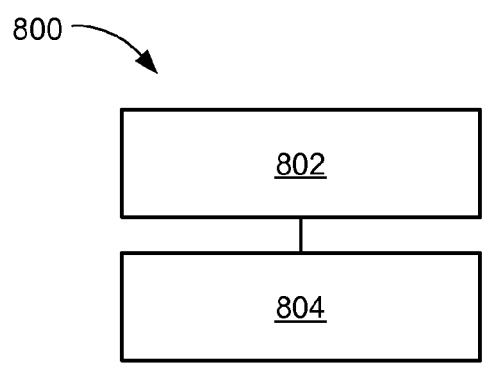
FIG. 8 is a flow chart of an integrated circuit package on package system for manufacturing the integrated circuit package on package system in an embodiment of the present invention.

Referring now to FIG. 8 is a flow chart of an integrated circuit package on package system 800 for manufacturing the integrated circuit package on package system 100 in an embodiment of the present invention. The system 800 includes providing a wafer in a block 802; forming a tape in a block 804; and a applying a paste and the tape on the wafer in a block 806.

In greater detail, a method to fabricate the integrated circuit package on package system 100, in an embodiment of the present invention, is performed as follows:

1. Forming the interconnect integrated circuit package having the substrate. (FIG. 1)
2. Forming the extended-lead leadframe with extended leads having an extension beyond the extent of the encapsulant over the integrated circuit. (FIG. 2)
3. Attaching the extended-lead integrated circuit package having the extended-lead leadframe on the substrate of the interconnect integrated circuit package and over the interconnect integrated circuit package. (FIG. 3)

It has been discovered that the present invention thus has numerous aspects.

An aspect is that the present invention serves as an interposer for additional devices and components. The side opposite the integrated circuit of the extended-lead leadframe provides electrical connectivity to the integrated circuits or other devices in the package. By bending the leads towards the integrated circuit, the extended-lead leadframe provides a connectivity surface.

It has been discovered that the disclosed structure provides improved yield. Testing each integrated circuit package individually ensures a known good package with a known good die. Integrated circuits and their packages can be sorted before additional processing. The improvements in yield, reliability and quality extend to the present invention as well as any system in which it is included.

It has also been discovered that the disclosed structure provides a smaller size. The footprint as well as area is more compact and space efficient. Multiple integrated circuits are efficiently placed over one another. It is particularly efficient in the critical dimensions for surface area with significant improvements over previous approaches.

Yet another discovery of the disclosed structure is improved manufacturing. The process can be implemented by adapting known, high volume and cost effective technologies. It also eliminates the need for special processes or features such as downset packaging, which may increase costs.

Yet another discovery of the disclosed structure is that many different devices may be included within the integrated circuit package system. Different functions particularly related functions could be combined. In the case of a system in package, I/O's, A/D's, sensors, memory and processors/logic could be interconnected and encapsulated in a single package.

These and other valuable aspects of the present invention consequently further the state of the technology to at least the next level.

Thus, it has been discovered that the integrated circuit package on package system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method of manufacture of an integrated circuit package on package system comprising:
    forming an interconnect integrated circuit package having an integrated circuit and an interconnect package encapsulant on a substrate;
    forming an extended-lead integrated circuit package having an extended-lead package encapsulant with a die paddle exposed and an extended lead having an extension from the extended-lead package encapsulant with clearance for the interconnect package encapsulant;
    attaching the extended-lead to the substrate with the extended-lead package encapsulant facing the interconnect package encapsulant; and
    applying a package encapsulant over and on the substrate locking the extended lead to the substrate, locking the interconnect package encapsulant to the substrate, and locking the extended lead to the extended-lead package encapsulant with the extended lead exposed from both the package encapsulant and the extended-lead package encapsulant.

2. The method as claimed in claim 1 further comprising attaching a top integrated circuit package on the extended-lead integrated circuit package.

3. The method as claimed in claim 1 wherein attaching the extended-lead integrated circuit package comprises forming an extended-lead leadframe having extended leads formed towards a top surface of a die paddle.

4. The method as claimed in claim 1 wherein attaching the extended-lead integrated circuit package comprises forming an extended-lead leadframe of the extended-lead integrated circuit package as an interposer.

5. The method as claimed in claim 1 further comprising attaching a quad flat no lead package on the extended lead integrated circuit package.

6. A method of manufacture of an integrated circuit package on package system comprising:
    forming an interconnect integrated circuit package having an integrated circuit and an interconnect package encapsulant on a mounting surface of a substrate;
    forming an extended-lead integrated circuit package having an extended-lead package encapsulant with a die paddle exposed and an extended lead having an extension from the extended-lead package encapsulant with clearance for the interconnect package encapsulant;
    attaching the extended lead to the mounting surface of the substrate with the extended-lead integrated circuit package over the interconnect integrated circuit package; and
    applying a package encapsulant over and on the substrate locking the extended lead to the substrate, locking the interconnect package encapsulant to the substrate, and locking the extended-lead to the extended-lead package encapsulant with the extended lead exposed from both the package encapsulant and the extended-lead package encapsulant.

7. The method as claimed in claim 6 wherein attaching the extended-lead integrated circuit package comprises forming a connectivity surface of an extended-lead leadframe of the extended-lead integrated circuit package.

8. The method as claimed in claim 6 further comprising attaching a top integrated circuit package on a connectivity surface of the extended-lead leadframe.

9. The method as claimed in claim 6 wherein attaching the extended-lead integrated circuit package comprises a surface mount process.

10. The method as claimed in claim 6 wherein attaching the extended-lead integrated circuit package comprises applying an encapsulant with a connectivity surface of an extended-lead leadframe substantially exposed.

11. An integrated circuit package on package system comprising:
    an interconnect integrated circuit package having an integrated circuit and an interconnect package encapsulant on a substrate;
    an extended-lead integrated circuit package having an extended-lead package encapsulant with a die paddle exposed and an extended lead having an extension from the extended-lead package encapsulant with clearance for the integrated circuit, the extended lead attached to the substrate with the extended-lead package encapsulant facing the interconnect package encapsulant; and
    a package encapsulant over and on the substrate locking the extended lead to the substrate, locking the interconnect package encapsulant to the substrate, and locking the extended lead to the extended-lead package encapsulant with the extended lead exposed from both the package encapsulant and the extended-lead package encapsulant.

12. The system as claimed in claim 11 further comprising a top integrated circuit package on the extended-lead integrated circuit package.

13. The system as claimed in claim 11 wherein the extended-lead integrated circuit package comprises an extended-lead leadframe having extended leads formed towards a top surface of a die paddle.

14. The system as claimed in claim 11 wherein the extended-lead integrated circuit package comprises an extended-lead leadframe of the extended-lead integrated circuit package as an interposer.

15. The system as claimed in claim 11 further comprising a quad flat no lead package attached on the extended-lead integrated circuit package.

16. The system as claimed in claim 11 wherein:
- the interconnect integrated circuit package is an interconnect integrated circuit package having the integrated circuit on the substrate; and
- the extended-lead integrated circuit package is an extended-lead integrated circuit package over the interconnect integrated circuit package having the extended lead on the substrate.

17. The system as claimed in claim 16 wherein the extended-lead integrated circuit package comprises a connectivity surface of an extended-lead leadframe of the extended-lead integrated circuit package.

18. The system as claimed in claim 16 further comprising a top integrated circuit package on a connectivity surface of the extended-lead leadframe.

19. The system as claimed in claim 16 wherein the extended-lead integrated circuit package is a surface mounted extended-lead package.

20. The system as claimed in claim 16 wherein the extended-lead integrated circuit package comprises an encapsulant with a connectivity surface of an extended-lead leadframe substantially exposed.

* * * * *

UNITED STATES PATENT AND TRADEMARK OFFICE
CERTIFICATE OF CORRECTION

| | | |
|---|---|---|
| PATENT NO. | : 7,986,043 B2 | |
| APPLICATION NO. | : 11/276646 | |
| DATED | : July 26, 2011 | |
| INVENTOR(S) | : Merilo et al. | |

It is certified that error appears in the above-identified patent and that said Letters Patent is hereby corrected as shown below:

Column 6:

line 4, after "connectivity." insert --System connectors 316, such as ball bonds, also provide electrical connectivity.--

Signed and Sealed this
Twenty-fifth Day of September, 2012

David J. Kappos
*Director of the United States Patent and Trademark Office*